(12) United States Patent
Jeon et al.

(10) Patent No.: US 6,496,426 B2
(45) Date of Patent: Dec. 17, 2002

(54) REDUNDANCY CIRCUIT OF SEMICONDUCTOR MEMORY DEVICE

(75) Inventors: Byung-Gil Jeon, Suwon; Ki-Nam Kim, Anyang, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/884,536

(22) Filed: Jun. 19, 2001

(65) Prior Publication Data

US 2002/0085431 A1 Jul. 4, 2002

(30) Foreign Application Priority Data

Dec. 28, 2000 (KR) .............................................. 00-83675

(51) Int. Cl.⁷ ................................................ G11C 7/00
(52) U.S. Cl. ..................... 365/200; 365/225.7
(58) Field of Search ............................. 365/200, 225.7, 365/230.06, 230.03, 201

(56) References Cited

U.S. PATENT DOCUMENTS 6,084,807 A * 7/2000 Choi ........................... 365/200

* cited by examiner

*Primary Examiner*—David Lam
(74) *Attorney, Agent, or Firm*—F. Chau & Associates, LLP

(57) ABSTRACT

A redundancy circuit for a semiconductor memory device. The redundancy circuit includes redundancy memory cells and a redundancy word line decoder. The redundancy word line decoder has a fuse circuit that includes fuses and an output signal. The output signal is in one of three states depending on input signals. The fuse circuit controls a cutting of the fuses in accordance with the input signals so as to replace defective normal memory cells with the redundancy memory cells depending on a type of defect experienced by the defective normal memory cells.

19 Claims, 7 Drawing Sheets

FIG.6

| A0 | A1 | A2 | A3 | B0 | B1 | SWL0 | SWL1 | SWL2 | SWL3 |
|---|---|---|---|---|---|---|---|---|---|
| 0 | 0 | 0 | 0 | 0 | 0 | 1 | 0 | 0 | 0 |
| 0 | 0 | 0 | 0 | 0 | 1 | 0 | 1 | 0 | 0 |
| 0 | 0 | 0 | 0 | 1 | 0 | 0 | 0 | 1 | 0 |
| 0 | 0 | 0 | 0 | 1 | 1 | 0 | 0 | 0 | 1 |

FIG. 10

| Fail Cell | RED_EN | FUSE_Enb | FUSE_EN | Ai FUSE | B0 FB0 | B0 FB1 | B0 FBD | B1 FB0 | B1 FB1 | B1 FBD | Comment |
|---|---|---|---|---|---|---|---|---|---|---|---|
| NO Fail | 0 | 1 | 0 | 0 | NC | NC | NC | NC | NC | NC | NO Repair |
| Cell 0 | | | | | C | NC | C | C | NC | C | SWL0 -> RSWL0 |
| Cell 1 | | | | | C | NC | C | NC | C | C | SWL1 -> RSWL1 |
| Cell 2 | | | | | NC | C | C | C | NC | C | SWL2 -> RSWL2 |
| Cell 3 | | | | | NC | C | C | C | C | C | SWL3 -> RSWL3 |
| Cell 0 | | | | | C | NC | C | NC | C | NC | SWL0 -> RSWL0 |
| Cell 1 | | | | | C | C | NC | C | C | C | SWL1 -> RSWL1 |
| Cell 1 | 1 | 0 | 1 | Cut All FA0 Fuse | | | | | | | SWL1 -> RSWL1 |
| Cell 3 | | | | | | | | | | | SWL3 -> RSWL3 |
| Cell 0 | | | | | | | | | | | |
| Cell 1 | | | | | C | C | NC | C | C | NC | |
| Cell 2 | | | | | | | | | | | |
| Cell 0 | | | | | | | | | | | SWL0 -> RSWL0 |
| Cell 1 | | | | | | | | | | | SWL1 -> RSWL1 |
| Cell 2 | | | | | | | | | | | SWL2 -> RSWL2 |
| Cell 3 | | | | | | | | | | | SWL3 -> RSWL3 |

*. 1 : Logic High    0 : Logic Low    NC : Fuse Not Cut    C : Fuse Cut

REDUNDANCY CIRCUIT OF SEMICONDUCTOR MEMORY DEVICE

BACKGROUND

1. Technical Field

The present invention relates generally to semiconductor memory devices and, in particular, to a redundancy circuit for a semiconductor memory device, the redundancy circuit for replacing failed main memory cells with redundancy memory cells according to the type of failure(s) experienced by the main memory cells.

2. Background Description

Currently, a trend exists of reducing the size of electronic products while increasing their functionality. The size minimization and functionality improvement of electronic products is greatly affected by the rapid developments in semiconductor memory devices, which become smaller in size while being imparted with increased functionality. However, such semiconductor memory devices require technologies to integrate a variety of functions and to minimize the occurrence of defects or contamination of the devices during manufacturing processes. Even when the occurrence of defects and contamination are regarded as important factors in determining the yield and the basic manufacturing cost of products, solving such problems is still very difficult. A redundancy circuit is used as a method to solve the problem of reduction in the yield of products resulting from occurrence of defects and contamination of the semiconductor memory device. Such a redundancy circuit plays a more important role in increasing the integration of a semiconductor memory device. Therefore, it is necessary to effectively reduce the occurrence of defects in a semiconductor memory device by using a redundancy circuit.

FIG. 1 is a diagram illustrating a method for making a unit repair of a single row in a semiconductor memory device, according to the prior art. That is, only a single row is repaired at one time. In a redundancy device such as that shown in FIG. 1, each redundancy pre-decoder replaces one row of redundancy cells. In other words, if a memory cell is defective, a row having the defective memory cell is replaced with a row of redundancy memory cells.

FIG. 2 is a diagram illustrating a conventional method for making a unit repair of two rows in a semiconductor memory device, according to the prior art. That is, one redundancy pre-decoder replaces two rows of redundancy cells. In other words, if a memory cell is defective, then one row having the defective memory cell and its neighboring row of normal memory cells are replaced with two rows of redundancy memory cells. The conventional repair method shown in FIG. 2 has an advantage in that any defect occurring at two neighboring rows can be repaired by one redundancy pre-decoder.

FIG. 3 is a diagram illustrating a conventional method for making a unit repair of four rows in a semiconductor memory device, according to the prior art. That is, one redundancy pre-decoder replaces four row rows of redundancy cells. In other words, if a memory cell is defective, then a row having the defective memory cell and its three neighboring rows of memory cells are replaced with four rows of redundancy memory cells. The conventional repair method shown in FIG. 3 has an advantage in that any defect occurring at four rows of memory cells can be repaired by one redundancy pre-decoder.

The conventional repair method illustrated in FIG. 1 has an advantage in that the probability of defects at the redundancy cells is low because the number of redundancy cells to replace defective memory cells is not great. On the contrary, the conventional repair method illustrated in FIG. 1 has a disadvantage in that a plurality of predecoders are needed when a plurality of defects occur at a plurality of neighboring rows.

Also, the conventional repair methods shown in FIGS. 2 and 3 have advantages in that a plurality of memory cells can be replaced by using one redundancy pre-decoder, thereby getting a plurality of defective memory cells to be replaced with neighboring rows of memory cells by one redundancy pre-decoder. However, there is a disadvantage in the aforementioned methods in that neighboring rows are replaced with redundancy rows of memory cells, along with a row having a failed memory cell; thus, the probability of defects occurring at the redundancy cells is increased.

SUMMARY OF THE INVENTION

The problems stated above, as well as other related problems of the prior art, are solved by the present invention, a redundancy circuit for a semiconductor memory device. The redundancy circuit replaces failed memory cells with redundancy cells according to the type of failure(s) experienced by the failed memory cells.

According to an aspect of the invention, there is provided a redundancy circuit for a semiconductor memory device having a plurality of normal memory cells. The redundancy circuit includes redundancy memory cells. A redundancy word line decoder has a fuse circuit that includes fuses and an output signal. The output signal is in one of three states depending on input signals. The fuse circuit controls a cutting of the fuses in accordance with the input signals so as to replace defective normal memory cells with the redundancy memory cells depending on a type of defect experienced by the defective normal memory cells.

According to another aspect of the invention, the fuse circuit is constructed to have a one-to-one correspondence to the input signals.

According to yet another aspect of the invention, the fuse circuit includes first, second and third fuses. The fuse circuit generates the output signal to be in the one of three states depending on the cutting of two fuses out of the first, second and third fuses in accordance with the input signals. The three states consist of a logic level that is identical to that of an input signal, a logic level that is opposite to that of the input signal, and a logic level that is unvarying with respect to that of the input signal.

According to still another aspect of the invention, the first and second fuses have first and second ends, respectively. The first ends of the first and second fuses are connected to the output of the fuse circuit.

According to yet still another aspect of the invention, the fuse circuit further includes an inverter for receiving the input signal. A first transistor has a first end, a second end, a third end, and a fourth end, connected to an input signal, a decoder enable control signal, an inverted decoder enable control signal, and the second end of the first fuse, respectively. A second transistor has a first end, a second end, a third end, and a fourth end, connected to an output of the inverter, the inverted decoder enable control signal, the decoder enable control signal, and the second end of the second fuse, respectively.

According to an additional aspect of the invention, there is provided a redundancy circuit for a semiconductor memory. The redundancy circuit includes redundancy memory cells for restoring defective memory cells. A redundancy word line decoder of the redundancy circuit includes a first fuse circuit, a second fuse circuit, and a logic part. The first fuse circuit is constructed with a plurality of fuses that include a first fuse and a second fuse. Each of the plurality of fuses respectively correspond to input signals of a main word line decoder. The first fuse circuit cuts a fuse corresponding to an input signal of the main word line decoder when the redundancy word line decoder is in operation. The second fuse circuit is constructed with another plurality of fuses that include a third fuse, a fourth fuse, and a fifth fuse. Each of the other plurality of fuses respectively correspond to input signals of a sub-word line decoder. The second fuse circuit cuts two fuses out of the third fuse, the fourth fuse, and the fifth fuse according to an input signal of the sub-word line decoder when the redundancy word line decoder is in operation. The first and the second fuse circuits respectively generate output signals in one of three states. The three states consist of a logic level that is identical to that of the input signal of the sub-word line decoder, a logic level that is opposite to that of the input signal of the sub-word line decoder, and a logic level that is unvarying with respect to that of the input signal of the sub-word line decoder. The logic part selects particular redundancy memory cells according to outputs of the first and second fuse circuits, and a redundancy decoder enable control signal.

These and other aspects, features and advantages of the present invention will become apparent from the following detailed description of preferred embodiments, which is to be read in connection with the accompanying drawings.

BRIEF DESCRIPTION OF THE DRAWINGS

FIG. 6 is a cell selection chart for making a repair in a redundancy circuit based on predetermined inputs, according to a illustrative embodiment of the present invention;

FIG. 10 illustrates a repair made to failed memory cells of a semiconductor memory device based upon various types of faults, according to a preferred embodiment of the present invention.

DETAILED DESCRIPTION OF PREFERRED EMBODIMENTS

Figure 1:
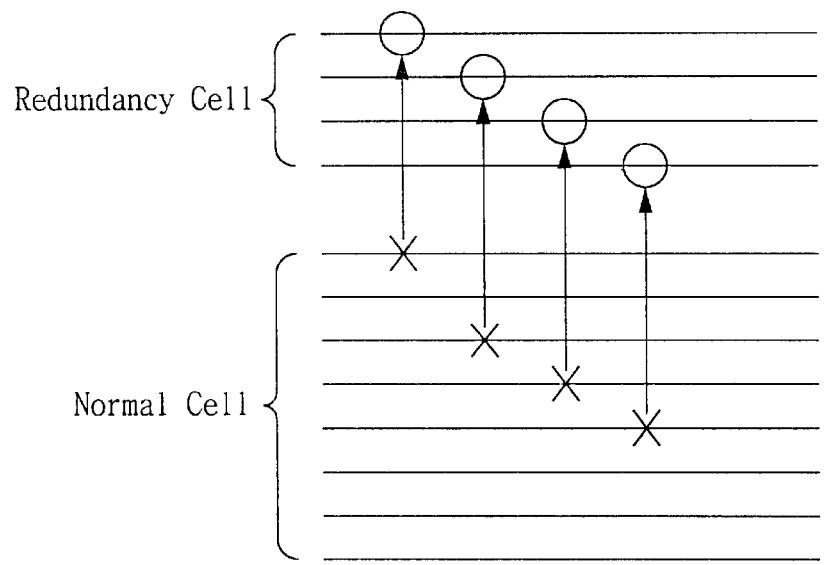
FIG. 1 is a diagram illustrating a method for making a unit repair of a single row in a semiconductor memory device, according to the prior art.
Figure 2:
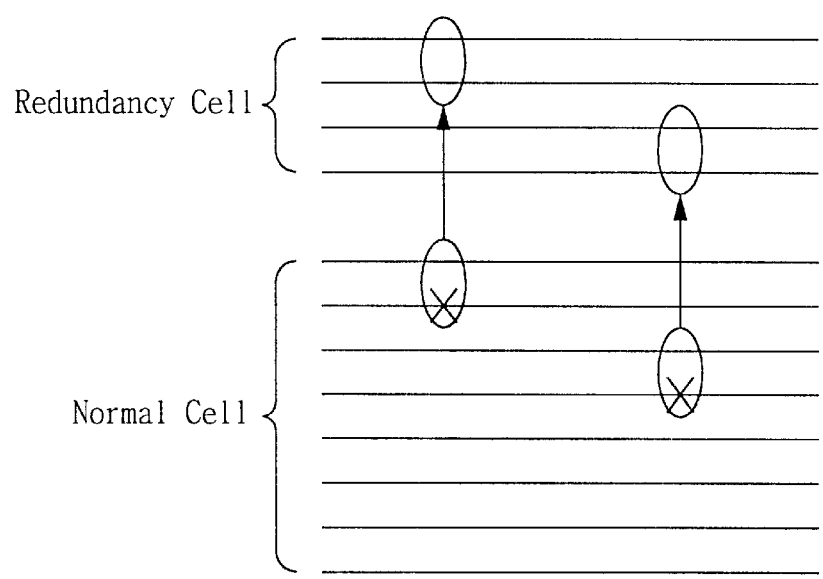
FIG. 2 is a diagram illustrating a method for making a unit repair of two rows in a semiconductor memory device, according to the prior art.
Figure 3:
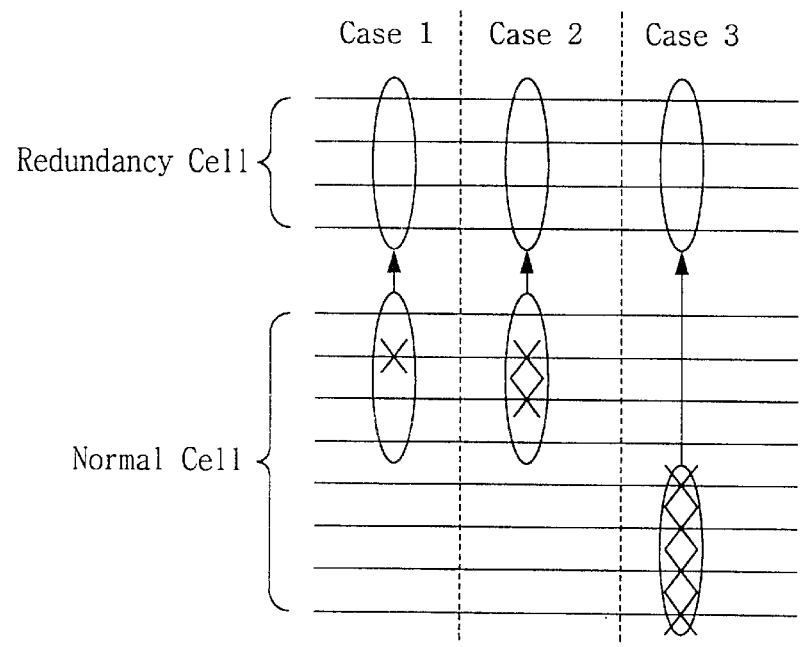
FIG. 3 is a diagram illustrating a method for making a unit repair of four rows in a semiconductor memory device, according to the prior art.
Figure 4:
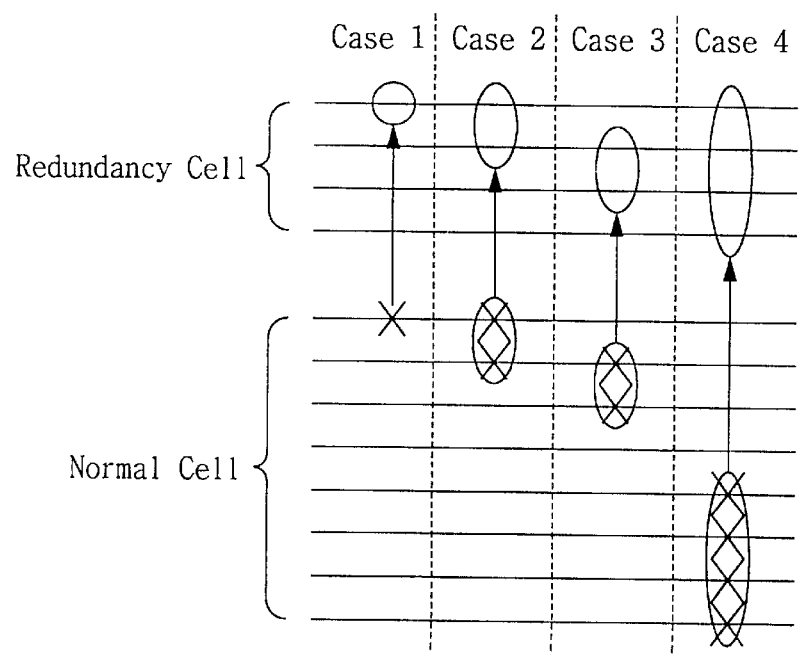
FIG. 4 is a diagram illustrating a method for making a repair to a semiconductor memory device based on various types of defects, according to an illustrative embodiment of the prevent invention.

FIG. 4 is a diagram illustrating a method for making a repair to a semiconductor memory device based on various types of defects, according to an illustrative embodiment of the present invention. The method classifies the various types of defects into 4 cases. Specifically, case 1 is used to replace one normal memory cell having a defect(s) with one redundancy cell. Cases 2 and 3 are used to respectively replace two normal memory cells having a defect(s) with two redundancy cells in correspondence with their addresses. Case 4 is used to replace four normal memory cells having a defect(s) with four redundancy cells.

Figure 5:
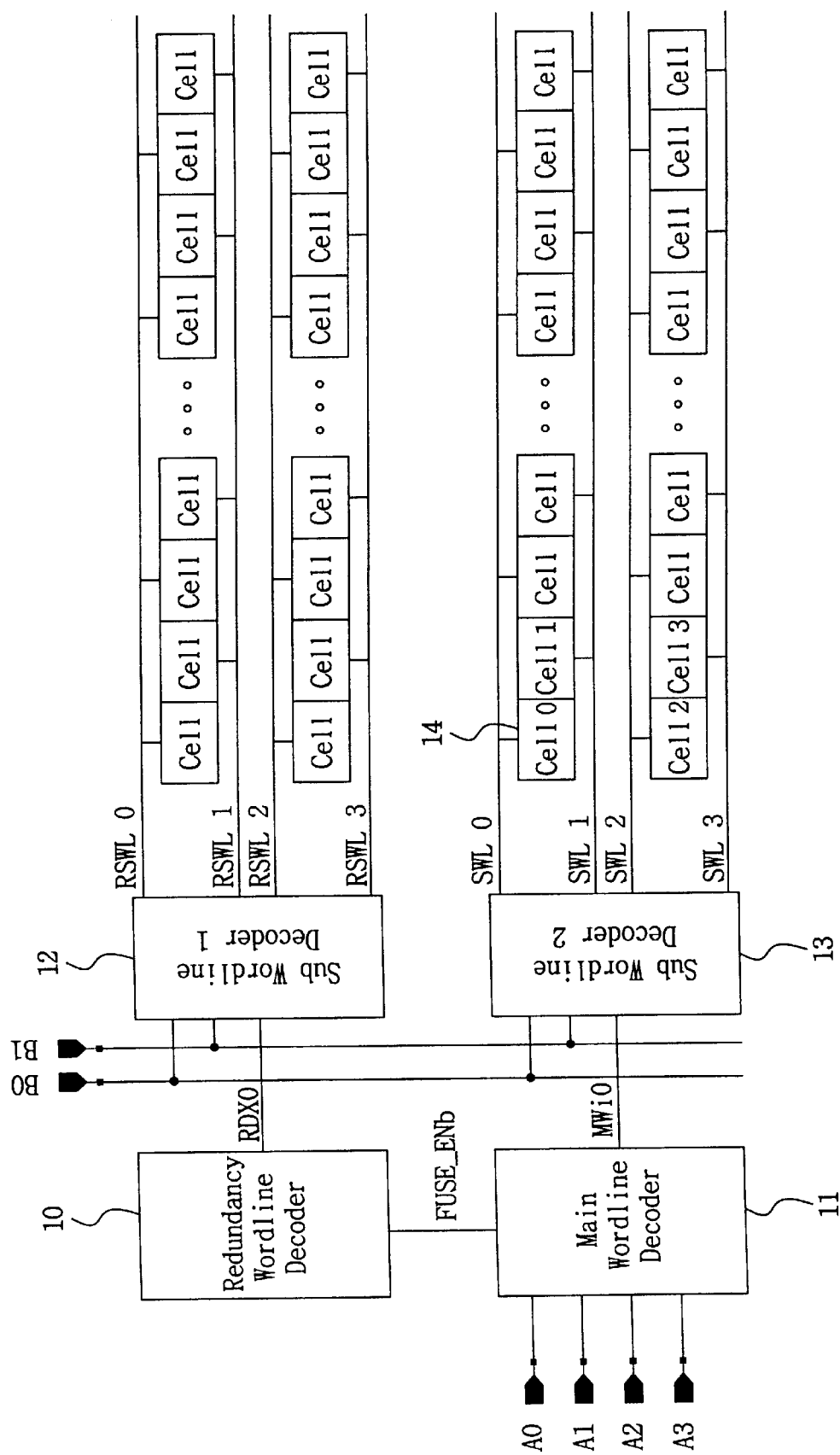
FIG. 5 is a block diagram illustrating a redundancy circuit, according to an illustrative embodiment of the present invention.

FIG. 5 is a block diagram illustrating a redundancy circuit, according to an illustrative embodiment of the present invention. The redundancy circuit includes a main memory cells connected with a main word line decoder 11, a sub-word line decoder2 13 and sub-word lines SWL0, SWL1, SWL2, SWL3. The redundancy circuit also includes redundancy memory cells connected with a redundancy word line decoder 10, a sub-word line decoder1 12 and redundancy sub-word lines RSWL0, RSWL1, RSWL2, RSWL3. The preceding elements of the redundancy circuit are in the same structure as the main memory cells. When all inputs A0, A1, A2, A3 of the main word line decoder 11 are at a low logic level ("0"), one of the sub-word lines that select the main memory cells is selected by a combination of MWO signals having the high logic level ("1") and by inputs B0 and B1 of the sub-word line decoder 13. That is, if inputs A0, A1, A2 and A3, and B0 and B1 are "0", then the SWL0 is selected for cell0 14. The selection of cells is illustrated according to the values (logic levels) of inputs A0~A3 and B0 and B1 in FIG. 6. FIG. 6 is a cell selection chart for making a repair in a redundancy circuit based on predetermined inputs, according to an illustrative embodiment of the present invention.

In the present invention, redundancy sub-word lines RSWL are correspondingly selected depending on the type (s) of defect occurring at more than one but less than four normal memory cells.

Figure 7:
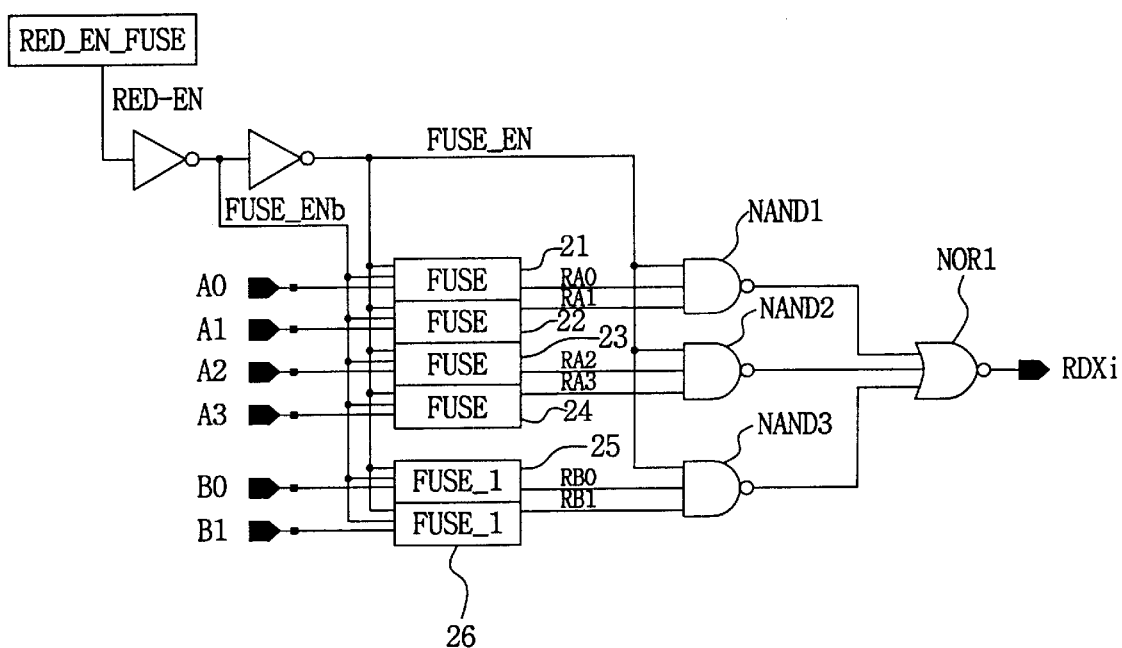
FIG. 7 is a diagram of a redundancy word line decoder, according to an illustrative embodiment of the present invention.

FIG. 7 is a diagram illustrating a redundancy word line decoder 10, according to an illustrative embodiment of the present invention. The circuit includes: a RED_EN signal to operate a redundancy decoder when a repair is made to failed memory cells; decoder input signals (A0-A3, B0, B1) and fuse boxes 21~26 respectively connected with the decoder input signals. The RED_EN signal is a redundancy decoder enable signal that is set at the low logic level when the redundancy word line decoder 10 is not in operation, but is set at the high logical level by cutting fuses when the redundancy word line decoder 10 is in operation. In addition, there are NAND gates NAND1~NAND3, and an output terminal NOR gate NOR1 having inputs provided from the NAND gates NAND1~NAND3. At this time, one of the decoder input signals, a fuse enable inversion signal FUSE_Enb and a fuse enable signal FUSE_EN are input to the fuse boxes 21~26. Each NAND gate receives outputs from two adjacent fuse boxes and an input of the FUSE_EN signal. The FUSE_Enb signal is kept at the high logic level when the redundancy word line decoder is not in operation, but it is kept at the low logic level when the redundancy word line decoder is in operation to turn off the main word line decoder 11. Furthermore, the FUSE_EN signal is kept at the low logic level when the redundancy word line decoder is not in operation, but it transitions to the high logic level when the redundancy word line decoder is in operation. On the other hand, an output of the NOR gate RDXi is kept at the low logic level when the redundancy word line decoder is not in operation. If the redundancy word line decoder is in operation, then an output of the NOR gate RDXi is kept at the high or low logic level according to the input signals A0, A1, A2, A3, B0, B1 and the state of the fuse boxes connected to the input signals. If the output signals RA0~RA3, RB0, and RB1 of the fuse boxes 21~26 transition to the high logic level, then the signal RDXi transitions to the high logic level to select redundancy memory cells in FIGS. 5 and 6.

The signals FUSE_Enb and FUSE_EN are used when the redundancy word line decoder is not in operation and when input signals A0~A3, B0, B1 of the redundancy word line decoder and output signals RA0~RA3, RB0, RB1 of the fuse boxes are blocked.

Figure 8:
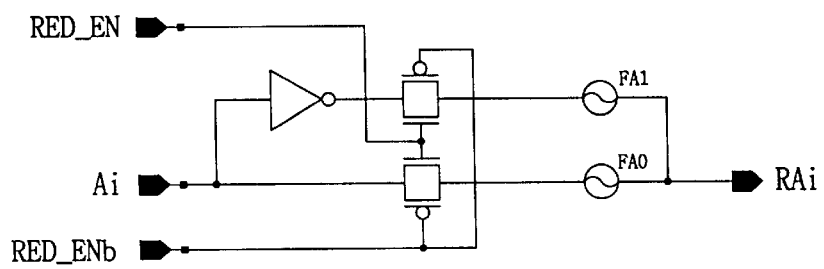
FIG. 8 is a circuit diagram of a fuse constructed in a redundancy word line decoder with an input Ai, according to an illustrative embodiment of the present invention.

FIG. 8 is a circuit diagram of a fuse constructed in a redundancy word line decoder with an input Ai, according to an illustrative embodiment of the present invention. In the illustrative embodiment, a circuit of a fuse is illustrated connected to input signals A0~A3 of the decoder, shown as FUSES 21~24 in FIG. 7. At this time, making a repair is controlled by cutting fuses FA0, FA1 that operate according to the input of signals RED_EN, RED_ENb and Ai.

In FIG. 8, while the redundancy word line decoder is in operation, if the fuse FA1 is cut, then an output signal RAi has the same logic level as the input signal Ai of the decoder. However, if the fuse FA0 is cut, then the output signal RAi has a logic level opposite to the input signal Ai. The circuit of the fuse shown in FIG. 8 has been generalized. As shown in the redundancy decoder in FIG. 7, the circuit of a fuse is inserted in the fuse boxes 21~24 connected to input signals A0, A1, A2 and A3, respectively.

Figure 9:
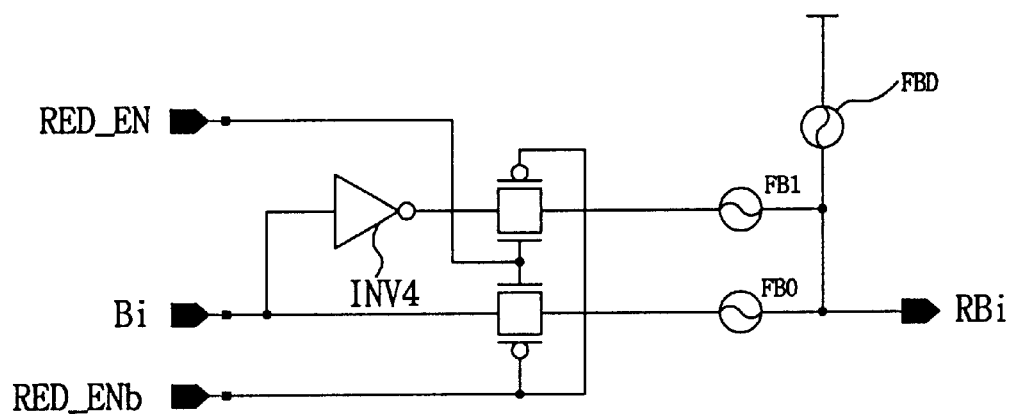
FIG. 9 is a circuit diagram of a fuse constructed in a redundancy word line decoder with an input Bi, according to an illustrative embodiment of the present invention.

FIG. 9 is a circuit diagram of a fuse constructed in a redundancy word line decoder with an input Bi, according to an illustrative embodiment of the present invention. In the illustrative embodiment, the circuit of a fuse is illustrated connected to input signals B0, B1, shown as FUSE_1 25~26 in FIG. 7. The circuit of a fuse shown in FIG. 9 is used to enable operations of the redundancy cells according to the type(s) of defect(s) if the memory cells shown in FIG. 4. The fuse circuit shown in FIG. 9 is constructed with the addition of a new fuse FBD to the fuse circuit shown in FIG. 8, that is, a fuse circuit connected to input signals B0, B1 of the decoder. The circuit includes fuses FB0, FB1 and a new fuse FBD, controlling the cutting of the three fuses in response to an input of the signals RED_EN, RED_Enb, Bi to make operations of redundancy cells possible according to the type(s) of defect of the failed memory cells.

The fuse FBD is installed between supply voltage VDD and an output signal Rbi of a fuse box. While the redundancy word line decoder is in operation, if the fuses FB1, FBD are cut, then the output signal Rbi has the same logic level as the input signal Bi; if the fuses FB0, FBD are cut, then the output signal Rbi has a logic level opposite to the input signal Bi; if the fuses FB0, FB1 are cut, then the output signal Rbi always has the high logic level regardless of the input signal Bi. In other words, if the redundancy word line decoder is in operation, then an output of the fuse circuit shown in FIG. 9 can correspond to one of three different states. The characteristic that the output of the fuse circuit can have a high logic level regardless of the input signal Bi enables the operations of the redundancy cells according to the type(s) of defect of the failed memory cells. The fuse applied to the fuse circuits shown in FIGS. 8 and 9 can be the one that can be electrically turned on/off or physically turned on/off.

FIG. 10 is a diagram illustrating a repair made to failed memory cells of a semiconductor memory device based upon various types of faults, according to a preferred embodiment of the present invention. The repair is made by replacing the failed memory cells with the redundancy cells of the redundancy circuit shown in FIGS. 4 through 9, in accordance with different cases in which different types of defects occur in the memory cells. In FIG. 10, the designations "1", "0", "NC" and "C" respectively indicate a high logic level, a low logic level, a fuse that is not cut and a fuse that is cut, respectively. The type(s) of failure of the memory cells shown in FIG. 10 are 1 cell failed, 2 cells failed, 3 cells failed and 4 cells failed. A detailed description will now be given regarding the performance of repairs according to the defect type(s) of failed memory cells.

Without an occurrence of a defect at the memory cells, there will be neither repair operations, nor cutting of fuses.

Next, if one memory cell fails, then the RED_EN_FUSE shown in FIG. 5 is cut to turn a signal RED_EN to the high logic level, the fuse box of A0, A1, A2 and A3 cuts the fuse FA0 shown in FIG. 8, and the fuse box of B0 cuts the fuses FB0 and FBD shown in FIG. 9. As a result, when an address to select SWL0 shown in FIG. 5 is input, the sub-word line SWL0 turns off and the redundancy word-line RSWL0 turns on. If an address to select any sub-word line SWL other than sub-word line SWL0 (sub-word lines SWL1, SWL2, SWL3), then the redundancy circuit shown in FIG. 5 will not be in operation. In the same method described above, when a memory cell 1, 2 or 3 fails, the fuse is cut to make a repair as shown in FIG. 10. Likewise, if only a memory cell fails, the fuse FBD of FUSE_1 shown in FIG. 9 is always cut.

Then, if two memory cells fail (e.g., memory cells 0 and 1), then RED_EN_FUSE shown in FIG. 7 is cut to turn a signal RED_EN to the high logic level, the fuse box of A0, A1, A2 and A3 cuts the fuse FA0 shown in FIG. 8, and the fuse box B0 cuts the fuses FB0 and FBD shown in FIG. 9 to transition a signal RB0 to a logic level opposite to the input signal B0, and the fuse box B1 cuts signals FB0 and FB1 to keep a signal RB1 at the high logic level all the time regardless of the state of the input signal B1. In other words, while all of the input signals A0, A1, A2, A3 are kept at the low logic level, memory cells fail both when the input signal B1 is at the low logic level (cell0) and when the input signal B1 is at the high logic level (cell1), so that an output signal RDXi operates regardless of the input signal B1 to enable redundancy sub-word lines RSW0 and RSWL1 to be selected at an input. If memory cells 1 and 3 fail, then a repair can be made in accordance with the above described method.

Furthermore, if three or four memory cells fail, then all four sub-word lines are replaced with redundancy sub-word lines. Therefore, if memory cells 0 through 2 or memory cells 0 through 3 fail, the RED_EN_FUSE shown in FIG. 7 is cut to transition a signal RED_EN to the high logic level, the fuse box of A0, A1, A2 and A3 cuts the fuse FA0 shown in FIG. 8, the fuse box cuts FB0 and FB1 shown in FIG. 9 to keep a signal RB0 at the high logic level all the time regardless of a logic level of the input signal B0, the fuse box B1 cuts FB0 and FB1 to keep a signal RB1 at the high logic level regardless of a logic level of the input signal B1. As a result, if an address to select sub-word line SWL0 is input, then redundancy sub-word line RSWL0 operates or, if an address is input to select sub-word lines SW1, SW2, SWL3, then redundancy sub-word lines RSWL1, RSWL2 and RSWL3 operate.

Advantageously, the redundancy circuit of the present invention has improved repair operations in that redundancy cells are used to replace main memory cells having a defect(s) depending on the type(s) of defect(s). That is, in contrast to a conventional redundancy circuit that constructs four redundancy rows for use by a single redundancy decoder to replace any number of failed memory cells (one or four), the redundancy circuit of the present invention repairs one row of memory cells when a single memory cell fails, two rows when two memory cells fail or four rows when three or four memory cells fail. Therefore, the present invention advantageously decreases the number of redundancy memory cells to be replaced to prevent a reduction in the efficiency of repair operations and advantageously repairs a plurality of memory cells that are "neighbors" of the failed memory cell to increase the efficiency of repair operations.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A redundancy circuit for a semiconductor memory device having a plurality of normal memory cells, the redundancy circuit comprising:
   redundancy memory cells; and
   a redundancy word line decoder having a fuse circuit that includes fuses and an output signal, the output signal being in one of three states depending on input signals, the fuse circuit for controlling a cutting of the fuses in accordance with the input signals so as to replace defective normal memory cells with the redundancy memory cells depending on a type of defect experienced by the defective normal memory cells.

2. The redundancy circuit according to claim 1, wherein the fuse circuit is constructed to have a one-to-one correspondence to the input signals.

3. The redundancy circuit according to claim 1, wherein the fuse circuit includes first, second and third fuses, the fuse circuit for generating the output signal to be in the one of three states depending on the cutting of two fuses out of the first, second and third fuses in accordance with the input signals, the three states consisting of a logic level that is identical to that of an input signal, the logic level that is opposite to that of the input signal, and the logic level that is unvarying with respect to that of the input signal.

4. The redundancy circuit according to claim 3, wherein the fuse circuit generates the one of three states when the redundancy word line decoder is operating.

5. The redundancy circuit according to claim 3, wherein the first and second fuses have first and second ends, respectively, the first ends of the first and second fuses being connected to the output of the fuse circuit.

6. The redundancy circuit according to claim 5, wherein the fuse circuit further comprises:
   an inverter for receiving the input signal;
   a first transistor having a first end, a second end, a third end, and a fourth end, connected to an input signal, a decoder enable control signal, an inverted decoder enable control signal, and the second end of the first fuse, respectively; and
   a second transistor having a first end, a second end, a third end, and a fourth end, connected to an output of the inverter, the inverted decoder enable control signal, the decoder enable control signal, and the second end of the second fuse, respectively.

7. The redundancy circuit according to claim 6, wherein the redundancy word line decoder further comprises another fuse circuit including first, second, and third fuses, and the redundancy word line decoder replaces, only one normal main memory cell having a defect with a redundancy memory cell, when the one normal memory cell fails, by cutting the first fuse and the second fuse or the third fuse of the fuse circuit according to an input signal corresponding to the one normal memory cell, two normal memory cells having the defect with two redundancy memory cells, when the two normal memory cells fail, by cutting the first fuse and the second fuse or the third fuse of the fuse circuit according to input signals corresponding to the two normal memory cells, and by cutting the second and third fuses of the other fuse circuit to keep logic levels of the fuse circuits constant regardless of the input signals corresponding to the two normal memory cells; or three or four normal memory cells having the defect with three or four redundancy memory cells, when the three or four normal memory cells fail, respectively, by cutting the second and third fuses of all fuse circuits to keep the logic levels of all of the fuse circuits constant, regardless of the input signal.

8. The redundancy circuit according to claim 3, wherein the first and the second fuses are constructed to be electrically turned on/off.

9. The redundancy circuit according to claim 3, wherein the first and the second fuses are constructed to be physically turned on/off.

10. A redundancy circuit for a semiconductor memory, comprising:
    redundancy memory cells for restoring defective memory cells; and
    a redundancy word line decoder, including,
        a first fuse circuit constructed with a plurality of fuses that include a first fuse and a second fuse, each of the plurality of fuses respectively corresponding to input signals of a main word line decoder, the first fuse circuit for cutting a fuse corresponding to an input signal of the main word line decoder when the redundancy word line decoder is in operation,
        a second fuse circuit constructed with another plurality of fuses that include a third fuse, a fourth fuse, and a fifth fuse, each of the other plurality of fuses respectively corresponding to input signals of a sub-word line decoder, the second fuse circuit for cutting two fuses out of the third fuse, the fourth fuse, and the fifth fuse according to an input signal of the sub-word line decoder when the redundancy word line decoder is in operation, the first and the second fuse circuits for respectively generating output signals being in one of three states, the three states consisting of a logic level that is identical to that of the input signal of the sub-word line decoder, the logic level that is opposite to that of the input signal of the sub-word line decoder, and the logic level that is unvarying with respect to that of the input signal of the sub-word line decoder, and
        a logic part for selecting particular redundancy memory cells according to outputs of the first and second fuse circuits, and a redundancy decoder enable control signal.

11. The redundancy circuit according to claim 10, wherein each of the third fuse, the fourth fuse, and the fifth fuse has a first end and a second end, the first end and the second end of the third fuse being connected to a supply voltage and the output of the second fuse circuit, respectively, the first ends of the fourth and fifth fuses being connected to the output of the second fuse circuit.

12. The redundancy circuit according to claim 11, wherein the second fuse circuit further comprises:
    an inverter for receiving the input signal of the sub-word line decoder;

a first transistor having a first end, a second end, a third end, and a fourth end, connected to an input signal, a decoder enable control signal, an inverted decoder enable control signal, and the second end of the fourth fuse, respectively;

a second transistor having a first end, a second end, a third end, and a fourth end, connected to an output of the inverter, the inverted decoder enable control signal, the decoder enable control signal, and the second end of the fifth fuse, respectively.

13. The redundancy circuit according to claim 12, wherein the redundancy word line decoder further comprises another second fuse circuit including third, fourth, and fifth fuses, and the redundancy word line decoder replaces, only one normal memory cell having a defect with a redundancy memory cell, when the one normal memory cell fails, by cutting the first fuse of the first fuse circuit that corresponds to the input signal of the main word line decoder and by cutting the third fuse and the fourth fuse or the fifth fuse of the second fuse circuit that correspond to relevant input signals of the sub-word line decoder, two normal memory cells having the defect with two redundancy memory cells, when the two normal memory cells fail, by cutting the fuse of the first fuse circuit that corresponds to the input signal of the main word line decoder, by cutting the third fuse and the fourth fuse or the fifth fuse of the second fuse circuit that correspond to the relevant input signal of the sub-word line decoder, and by cutting the fourth and fifth fuses of the other second fuse circuit to keep logic levels of the fuse circuits constant, regardless of the input signal, or three or four normal memory cells having the defect with four redundancy memory cells. When the three or four normal memory cells fail, respectively, by cutting the fuse of the first fuse circuit that corresponds to the input signal of the main word line decoder and by cutting the fourth and fifth fuses of all of the second fuse circuits of the sub-word line decoder to keep the logic levels of all of the fuse circuits constant, regardless of the input signal.

14. The redundancy circuit according to claim 10, wherein the first through fifth fuses are constructed to be electrically turned on/off.

15. The redundancy circuit according to claim 10, wherein the first through fifth fuses are constructed to be physically turned on/off.

16. A redundancy circuit for a semiconductor memory device, comprising:

redundancy memory cells; and a redundancy word line decoder having a first plurality of fuse circuits respectively corresponding to a plurality of main word line input signals and a second plurality of fuse circuits respectively corresponding to a plurality of sub-word line input signals, the redundancy word line decoder for cutting fuses in the pluralities of fuse circuits according to the plurality of main word line input signals and the plurality of sub-word line input signals so as to replace defective normal memory cells with the redundancy memory cells depending on a type of defect of the defective normal memory cells, wherein each of the second plurality of fuse circuits respectively have output signals that are capable of being in one of three states, the three states consisting of a logic level that is identical to that of one of the plurality of sub-word line input signals, the logic level that is opposite to that of the one of the plurality of sub-word line input signals, and the logic level that is unvarying with respect to the one of the plurality of sub-word line input signals.

17. The redundancy circuit according to claim 16, wherein each of the first plurality of fuse circuits comprises:

first and second fuses, each of the first and second fuses having a first end and a second end, the first ends of the first and second fuses being connected to the output of the fuse circuit;

a first inverter for receiving the one of the plurality of sub-word line input signals;

a first transistor having a first end, a second end, a third end, and a fourth end, connected to an input signal, a decoder enable control signal, an inverted decoder enable control signal, and the second end of the first fuse, respectively; and a second transistor having a first end, a second end, a third end, and a fourth end, connected to an output of the first inverter, the inverted decoder enable control signal, the decoder enable control signal, and the second end of the second fuse, respectively.

18. The redundancy circuit according to claim 17, wherein each of the second plurality of fuse circuits comprises:

third, fourth, and fifth fuses, each of the third, fourth, and fifth fuses having a first end and a second end, the first ends of the first, second, and third fuses being connected to the output of the fuse circuit, the second end of the third fuse being connected to a supply voltage;

a second inverter for receiving the one of the plurality of sub-word line input signals;

a third transistor having a first end, a second end, a third end, and a fourth end, connected to an input signal, a decoder enable control signal, an inverted decoder enable control signal, and the second end of the third fuse, respectively; and a fourth transistor having a first end, a second end, a third end, and a fourth end, connected to an output of the second inverter, the inverted decoder enable control signal, the decoder enable control signal, and the second end of the fourth fuse, respectively.

19. The redundancy circuit according to claim 18, wherein the redundancy word line decoder replaces, only one normal memory cell having a defect with a redundancy memory cell, when the one normal memory cell fails, by cutting the first fuse of one of the first plurality of fuse circuits according to a main word line decoder input signal and by cutting the third fuse and the fourth fuse or the fifth fuse of one of the second plurality of fuse circuits according to a sub-word line input signal, two normal memory cells having the defect with two redundancy memory cells, when the two normal memory cells fail, by cutting the first fuse of one of the first plurality of fuse circuits according to the main word line decoder input signal, by cutting the third fuse and the fourth fuse or the fifth fuse of one of the second plurality of fuse circuits according to at least one of the sub-word line input signals, and by cutting the fourth and fifth fuses of the other of the second plurality of fuse circuits to keep logic levels of the second plurality of fuse circuits constant, regardless of the input signal, or three or four normal memory cells having the defect with four redundancy memory cells, when the three or four normal memory cells fail, respectively, by cutting the first fuse of one of the first plurality of fuse circuits according to the main word line decoder input signal, and by cutting the fourth and fifth fuses of all of the second plurality of fuse circuits to keep the logic levels of all of the second plurality of fuse circuits constant, regardless of the input signal.

* * * * *